United States Patent [19]

Thakur et al.

[11] Patent Number: 5,425,392

[45] Date of Patent: Jun. 20, 1995

[54] METHOD DRAM POLYCIDE ROWLINE FORMATION

[75] Inventors: Randhir P. S. Thakur; Fernando Gonzalez; Annette L. Martin, all of Boise, Id.

[73] Assignee: Micron Semiconductor, Inc., Boise, Id.

[21] Appl. No.: 67,660

[22] Filed: May 26, 1993

[51] Int. Cl.$^6$ ............................... H01L 21/8239
[52] U.S. Cl. ............................. 437/173; 437/52; 437/174; 437/233; 437/248
[58] Field of Search ............... 437/52, 60, 200, 173, 437/174, 233, 235, 238, 248, 40; 148/DIG. 91

[56] References Cited

U.S. PATENT DOCUMENTS

| | | | |
|---|---|---|---|
| 4,567,058 | 1/1986 | Koh | 437/173 |
| 4,683,144 | 7/1987 | Nishimura et al. | 437/173 |
| 4,843,030 | 7/1989 | Eden et al. | 437/173 |
| 4,912,065 | 3/1990 | Mizumo et al. | 437/173 |
| 4,957,777 | 9/1990 | Ilderem et al. | 437/200 |
| 5,011,789 | 4/1991 | Burns | 437/81 |
| 5,025,741 | 6/1991 | Suwanai et al. | 437/919 |
| 5,057,447 | 10/1991 | Paterson | 437/200 |

FOREIGN PATENT DOCUMENTS

| | | | |
|---|---|---|---|
| 0045923 | 3/1982 | Japan | 437/165 |
| 0050428 | 3/1982 | Japan | 437/165 |
| 1220431 | 9/1989 | Japan . | |
| 0222527 | 9/1990 | Japan . | |

OTHER PUBLICATIONS

Ghandhi, "VLSI Fabrication Principles," John Wiley & Sons, 1983, pp. 591-592.
Wolf "Silicon Processing for VLSI Era", LaHice Press, 1986 pp. 56-58, 161-182.
Mayo, "Photodeposition: Enhancement of Deposition by Heat and Light" Solid State Technology. 1986 pp. 141-1986.

Primary Examiner—Tom Thomas
Attorney, Agent, or Firm—David J. Paul

[57] ABSTRACT

The present invention teaches a method for reducing sheet resistance in the fabrication of semiconductor wafers. A silicon substrate having a gate oxide layer thereon is provided in a chamber. Subsequently, a polysilicon layer is formed superjacent the gate oxide layer in situ by exposing the silicon substrate to a first gas comprising at least one of silane, disilane, and dichlorosilane, and radiant energy at a temperature substantially within the range of 500° C. to 1250° C. for at least 10 seconds. The polysilicon substrate can be doped with a material such as phosphorus, arsenic and boron for example, by exposing the polysilicon to a second gas under the stated conditions. A conductive layer comprising at least one of tungsten silicide ($WSi_x$) and titanium silicide ($TiSi_x$) can be formed superjacent the polysilicon by exposing the polysilicon to a third gas comprising at least one of $WF_6$, TMAT and $TiCl_4$.

1 Claim, 3 Drawing Sheets

METHOD DRAM POLYCIDE ROWLINE FORMATION

FIELD OF THE INVENTION

The present invention relates to a method for fabricating semiconductor wafers. More particularly, the present invention pertains to a method for reducing sheet resistance in the fabrication of semiconductor wafers.

BACKGROUND OF THE INVENTION

In the fabrication of semiconductor wafers, sheet resistance has become a driving issue. This has become of particular significance in the row line formations associated with Dynamic Random Access Memory ("DRAM") devices illustrated in FIG. 1.

Sheet resistance is defined as the resistance measured across the conductive layer which is positioned atop of transistor structure. Typically, comprising tungsten silicide ($WSi_x$) and titanium silicide ($TiSi_x$), this layer ultimately forms the rowline of a DRAM. Standard annealing process steps in forming the conductive layer, such as tungsten silicide ($WSi_x$), superjacent the transistor structure have yielded a sheet resistance on the order of 8 $\Omega/\Box$.

Sheet resistance directly correlates with propagation delay, switching speed and device size. This is supported by the principal that the lower the sheet resistance, the greater the number of electrons that will flow. Thus, the size, capacity and speed are all dependent on the electrical characteristics of the conductive layer. The following mathematical relationship exists between resistance and size:

$$R = Q*L* [1/(w_c*t)]$$

where
R = Resistance;
Q = Resistivity constant dependent on the material employed;
L = Length of the conductive layer;
$W_c$ = Cross-sectional width of the conductive layer; and
t = Thickness of the conductive layer.

Given this equation, resistivity is inversely proportional to the thickness of the conductive layer at issue. As such, in order to lower the resistivity of the conductive layer, one solution proposed has been to increase the thickness of the layer. While this approach is theoretically feasible, it is impractical. Stress cracks can potentially form over thicker conductive layers.

Options of overcoming this stress limitation have involved using higher temperature processes in fabricating the conductive layer. Unfortunately, this higher temperature processing causes structural degradation and alters the $V_T$ for the device. As a result of this degeneration, sandwiched layers, particularly the conductive layer and the gate oxide layer of the transistor, begin to interact and leak amongst each other. Fundamentally, this is caused by the extensive time required in reaching the high temperature necessary for processing the device under this approach.

Therefore, in order to drive a larger circuit, an alternate method is required that lowers sheet resistance. Further, a method is needed that will not cause structural layers to interact, leak and contaminate amongst each other. Moreover, there is a demand for a method that will enable the feasible manufacture of faster, smaller, more powerful devices.

SUMMARY OF THE INVENTION

The primary advantage of the present invention is to eliminate the aforementioned drawbacks of the prior art.

A further advantage of the present invention is to provide a method for fabricating semiconductor wafers that lowers sheet resistance.

Another advantage of the present invention is to provide a method for fabricating semiconductor wafers that will not cause structural layers to interact, leak and contaminate amongst each other.

Still advantage of the present invention is to provide a method for fabricating semiconductor wafers that will enable the feasible manufacture of faster, smaller, more powerful devices.

In order to achieve these hereinabove objects, as well as others which will become apparent hereafter, a method is disclosed for reducing sheet resistance in the fabrication of semiconductor wafers. In the first embodiment of the present invention, a silicon substrate having a gate oxide layer superjacent is provided in a chamber. Subsequently, a polysilicon layer is formed superjacent the gate oxide layer in situ by exposing the silicon substrate to a first gas comprising at least one of silane, disilane, and dichlorosilane, and radiant energy generating a temperature substantially within the range of 500° C. to 1250° C. for at least 10 seconds.

In a second embodiment of the present invention, the polysilicon substrate is doped with a material comprising at least one of a group III and group V element of the periodic table, such as phosphorus, arsenic and boron for example, by exposing the polysilicon to a second gas having ambient characteristics and radiant energy generating a temperature substantially within the range of 500° C. to 1250° C. for at least 10 seconds.

In a third embodiment of the present invention, a conductive layer comprising at least one of tungsten silicide ($WSi_x$) and titanium silicide ($TiSi_x$) is formed superjacent the polysilicon by exposing the polysilicon to a third gas comprising at least one of $WF_6$, TMAT and $TiCl_4$, and radiant energy generating a temperature substantially within the range of 500° C. to 1250° C. for at least 10 seconds.

In another embodiment of the present invention, the step of doping the polysilicon layer and the step of forming a conductive layer are performed simultaneously to thereby reduce the number of processing steps, as well as the overall thermal budget of the process.

Other objects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
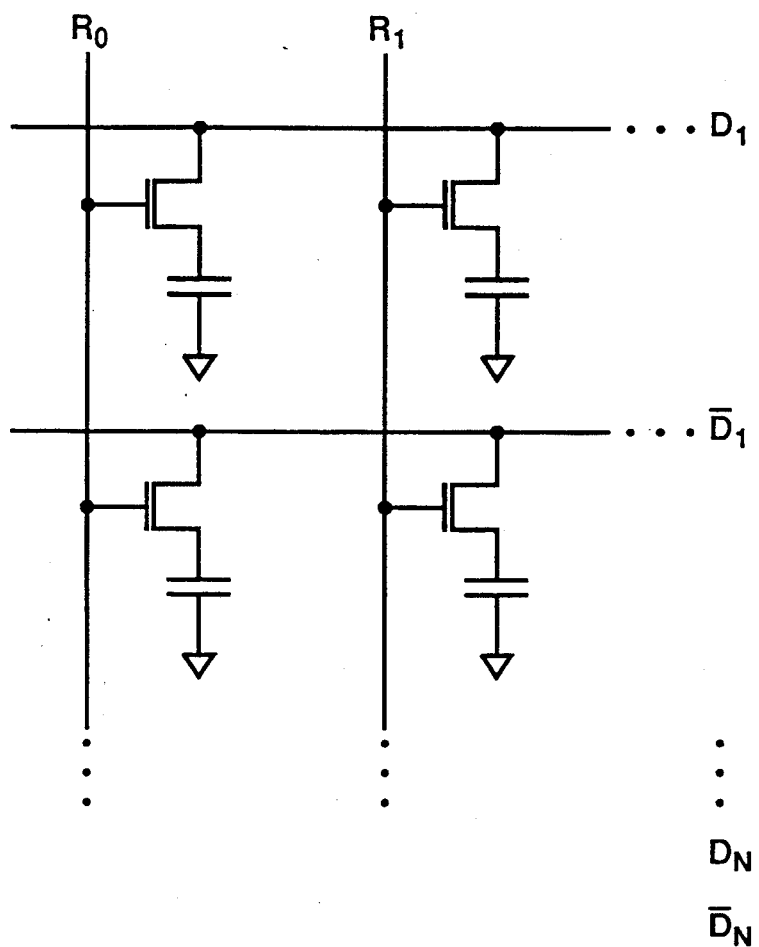
FIG. 1 illustrates a typical rowline formation in a Dynamic Random Access Memory ("DRAM")
Figure 2:
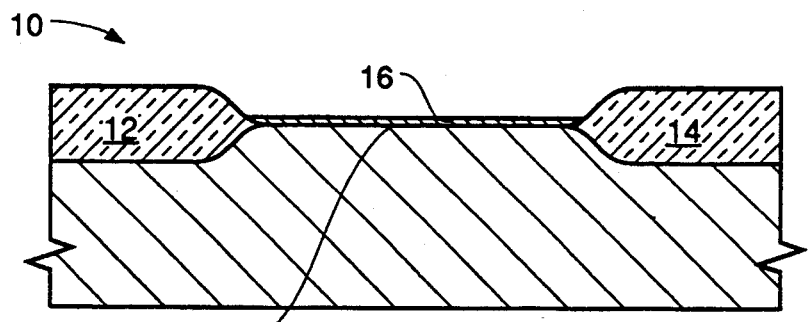
FIG. 2 is a cross-sectional view of a semiconductor substrate prior to undergoing the steps of the present invention.

Referring to FIG. 2, a cross-sectional view of a semiconductor substrate 10 is illustrated prior to undergoing the process of the present invention. Substrate 10 comprises two thick field oxide regions, 12 and 14, and a thin gate oxide layer 16. Directly below thin gate oxide layer 16 is an active area 18. Substrate 10, comprising the above mentioned gate oxide layer 16, and oxide regions, 12 and 14, is initially positioned in a chamber.

Figure 3:
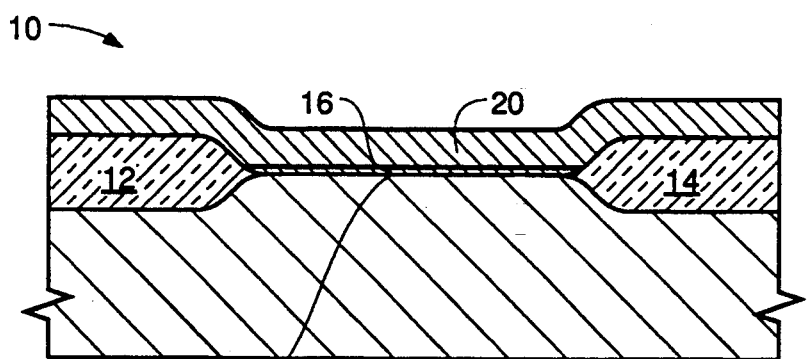
FIG. 3 is a cross-sectional view of a semiconductor substrate undergoing a first embodiment of the present invention.

Referring to FIG. 3, a cross-sectional view of semiconductor substrate 10 is depicted undergoing the first embodiment of the present invention. Relying on RTCVD principles, a polysilicon layer 20 is formed superjacent the gate oxide layer 16 by exposing substrate 10 to a first gas and radiant energy.

RTCVD principles allow a growth rate of polysilicon of up to approximately 2000 Å/min. Performing a reduced pressure (i.e., at pressures of 1 mTorr and below) deposition of polysilicon, while simultaneously doping in-situ is usually accomplished at a rate of 500 Å/min.

The preferred apparatus for performing such a process is a single wafer Rapid Thermal assisted CVD system (RTCVD). Some examples include the Inteqra model manufactured by A.G. Associates in Sunnyvale, Calif., and the Centura model manufactured by Applied Materials, also of Sunnyvale, Calif. An alternative to the single wafer instruments, are the integrated batch processing systems, such as the ASM 600/2 manufactured by ASM in the Netherlands, and Semitherm's batch cluster machines. The batch processing systems should be adequately optimized for the process, as there preferred parameters will differ from the single wafer RTCVD systems. The difference in optimization of the systems is based on the fact that the RTCVD systems are cold wall systems, while the batch cluster systems are hot wall systems.

RTCVD is the preferred system as there are essentially no gas phase reactions in a cold wall system. The wafer is essentially the only thermal mass in the RTCVD chamber, and the incoming gases decompose and react at the wafer surface.

In contrast, the LPCVD furnaces do tend to have gas phase reactions which occur at temperatures reaching approximately 600° C. The LPCVD systems are hot wall systems, and consequently, particulate deposition occurs on the tube.

In forming polysilicon layer 20, the first gas preferably comprises silane, disilane, or dichlorosilane, though other gases known to one of ordinary skill in the art may also be employed. Further, the radiant energy generates a temperature substantially within the range of 500° C. to 1250° C. for at least 10 seconds. This energy may be generated by means of RTP type lamps for example, though other approaches known to one of ordinary skill in the art, scuh as RF heat soruce, lasers, and electron beam heating for example, may also be employed. The extent to which substrate 10 is exposed to the radiant energy is dependent on the thickness of polysilicon layer 20 desired, as well as the energy source utilized.

Figure 4:
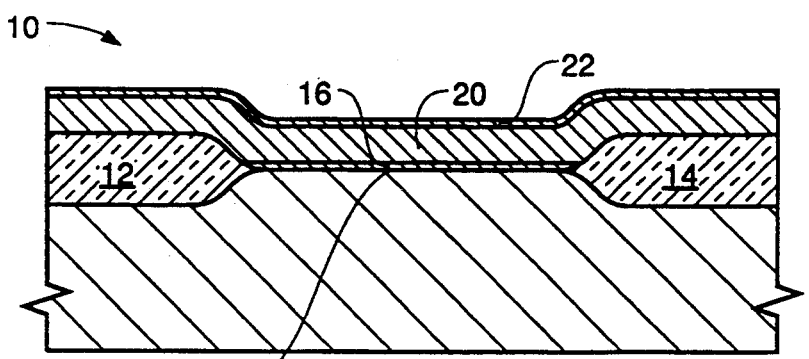
FIG. 4 is a cross-sectional view of the semiconductor substrate undergoing a second embodiment of the present invention.

Referring to FIG. 4, a cross-sectional view of semiconductor substrate 10 is depicted undergoing the second embodiment of the present invention. Relying on RTCVD principles, polysilicon layer 20, with gate oxide layer 16 subjacent, is doped by exposing substrate 10 to a second gas and radiant energy. Polysilicon layer 20 is doped with a material 22 comprising either a group III or group V element of the periodic table, such as arsenic and boron for example. However, phosphorus is preferred.

In doping polysilicon layer 20 with material 22, the second gas comprises ambient characteristics. Ambient characteristics refers to the creation of an atmosphere or ambient which is essentially free of oxygen. This usually requires the flowing of a gas into the chamber. Gases used to create ambient characteristics include, but are not limited to: argon (Ar), nitrogen ($N_2$), and ammonia ($NH_3$). Further, the radiant energy generates a temperature substantially within the range of 500° C. to 1250° C. for at least 10 seconds.

Figure 5:
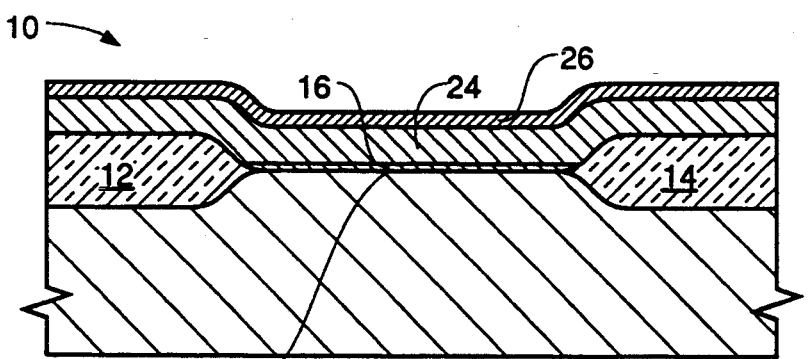
FIG. 5 is a cross-sectional view of the semiconductor substrate undergoing a third embodiment of the present invention.

Referring to FIG. 5, a cross-sectional view of semiconductor substrate 10 is illustrated having undergoing the third embodiment of the present invention. Relying on RTCVD principles, a conductive layer 26 is formed superjacent doped polysilicon layer 24 by exposing polysilicon layer 24 to a third gas and radiant energy. Conductive layer 26 comprises either tungsten silicide ($WSi_x$) and titanium silicide ($TiSi_x$), though other materials known to one of ordinary skill in the art may also be employed. The "x" has an approximate range of 2.1 to 2.9, and is a function of the deposition conditions and chemistries of the reacting species.

The silicide film is preferably deposited in-situ (i.e., in the same reaction chamber), and annealed therein, thereby achieving a lower row line sheet resistance.

In forming conductive layer 26 superjacent doped polysilicon layer 24, the selection of the third gas depends on the material selected for conductive layer 26. If, for example, conductive layer 26 is to be formed from tungsten silicide ($WSi_x$), the third gas preferably comprises $WF_6$. However, should conductive layer 26 be formed from titanium silicide ($TiSi_x$), the third gas preferably comprises either TMAT or $TiCl_4$. Again, it should be obvious to one of ordinary skill in the art that other gases could be employed to achieve the identical purpose of these gases.

Further, the radiant energy generates a temperature substantially within the range of 500° C. to 1250° C. for at least 10 seconds. This energy may be generated by means of RTP type lamps for example, though other approaches known to one of ordinary skill in the art may also be employed. The extent to which conductive layer 26 is exposed to the radiant energy is dependent on the thickness of layer 26 and the energy source utilized.

Figure 6:
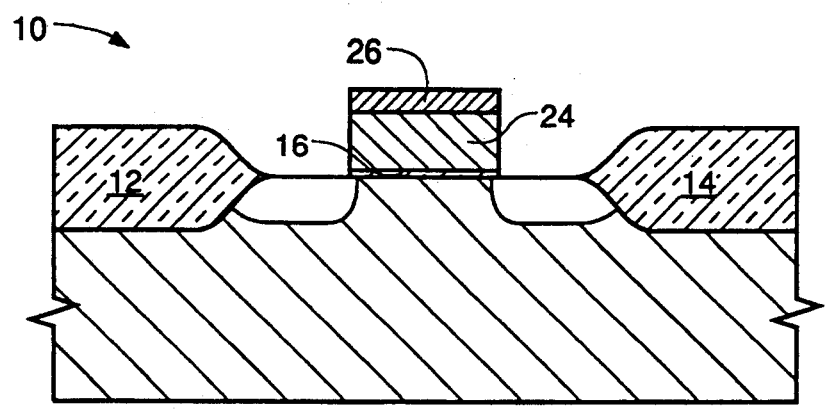
FIG. 6 is a cross-sectional view of a completed semiconductor structure.

Referring to FIG. 6, a cross-sectional view of a completed semiconductor structure is depicted having undergone all three embodiments of the present invention, as well as process steps known in the art to one of ordinary skill in the art. Employing all three embodiments, a sheet resistance of 4 Ω/☐ has been measured across conductive layer 26. Therefore, the sheet resistance of the polysilicon and silicide layer together is likewise reduced. The low pressure polysilicon deposition, in combination with the in-situ doping results in a structurally and electrically superior polysilicon film.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. For example, it should be noted that any of the hereinabove embodiments employing the step of exposing rely on the principles of Rapid Thermal Processing ("RTP"), and more particularly Rapid Thermal Chemical Vapor Deposition ("RTCVD"). However, one of ordinary skill in the art could alternatively employ the principles of Chemical Vapor Deposition ("CVD") and Low Pressure Chemical Vapor Deposition ("LPCVD") in the present inventive method. It is therefore contemplated that the appended claims will cover any such modifications or embodiments as fall within the true scope of the invention.

What is claimed is:

1. A method for reducing sheet resistance of a conductive rowline feature, comprising the steps of:

providing a silicon substrate having a gate oxide layer superjacent within a chamber;

forming a polysilicon layer superjacent said gate oxide layer in situ by exposing said silicon substrate to a first gas and radiant energy, said energy generating a temperature within the range of 500° C. to 1250° C. for at least 10 seconds by rapid thermal processing, said first gas comprising at least one of silane, disilane, and dichlorosilane;

doping said polysilicon substrate with phosphorus by exposing said silicon substrate to radiant energy and a second gas, said energy generating a temperature substantially within the range of 500° C. to 1250° C. for at least 10 seconds by rapid thermal processing; and forming a conductive layer superjacent said polysilicon by exposing said silicon substrate to radiant energy and a third gas, said conductive layer comprising at least one of tungsten silicide and titanium silicide, said energy generating a temperature substantially within the range of 500° C. to 1250° C. for at least 10 seconds by rapid thermal processing, said third gas comprising at least one of $WF_6$, TMAT and $TiCl_4$.

* * * * *